United States Patent [19]

Suga et al.

[11] Patent Number: 4,947,236
[45] Date of Patent: Aug. 7, 1990

[54] SEMICONDUCTOR DEVICE

[75] Inventors: Toru Suga, Tokyo; Kazuhiko Inoue, Yokohama, both of Japan

[73] Assignee: Kabushiki Kaisha Toshiba, Kawasaki, Japan

[21] Appl. No.: 278,317

[22] Filed: Dec. 1, 1988

[30] Foreign Application Priority Data

Dec. 2, 1987 [JP] Japan .................................. 62-303372

[51] Int. Cl.⁵ ............................................. H01L 23/48
[52] U.S. Cl. ....................................... 357/68; 357/72; 357/70; 357/74
[58] Field of Search .................... 357/68, 72, 70, 74

[56] References Cited

FOREIGN PATENT DOCUMENTS 61-101063  5/1986  Japan ..................................... 357/70
63-52455   3/1988  Japan ..................................... 357/70

Primary Examiner—Rolf Hille
Assistant Examiner—Steven Loke
Attorney, Agent, or Firm—Finnegan, Henderson, Farabow, Garrett, and Dunner

[57] ABSTRACT

A semiconductor device includes an SIL type package for projection of the pellet of a Hall sensor used for detecting the position of a motor. An inclined portion is formed on an edge portion which faces the motor coil so that the edge portion will come into area-contact with the motor coil even if they come into contact with each other, thus causing no stress concentration on the motor coil.

16 Claims, 3 Drawing Sheets

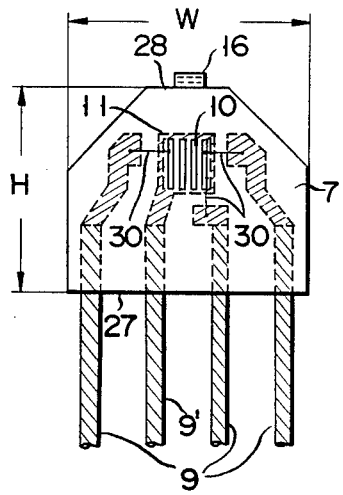
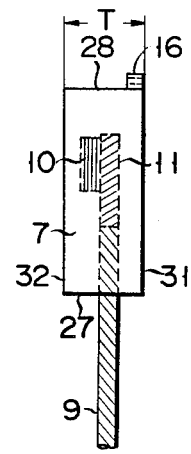
FIG. IA
(PRIOR ART)
FIG. IB
(PRIOR ART)
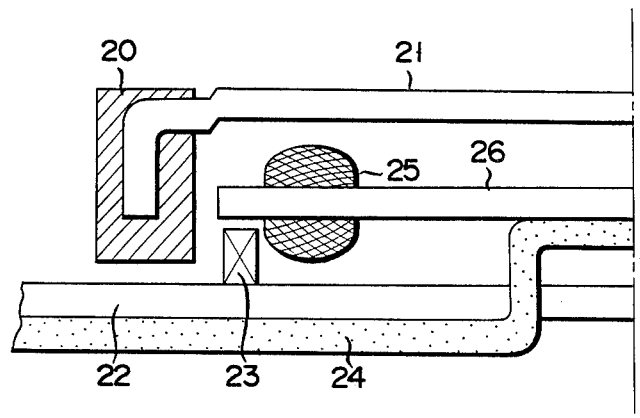
FIG. 2
(PRIOR ART)

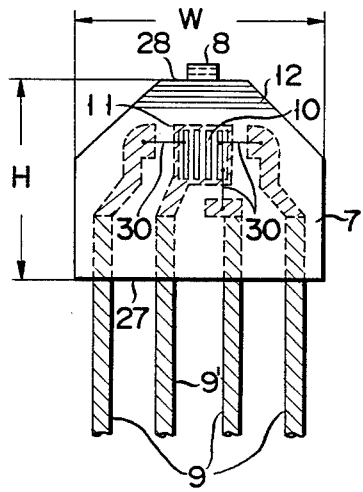 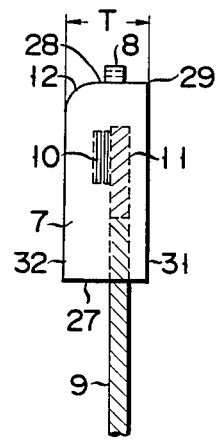
FIG. 3A    FIG. 3B
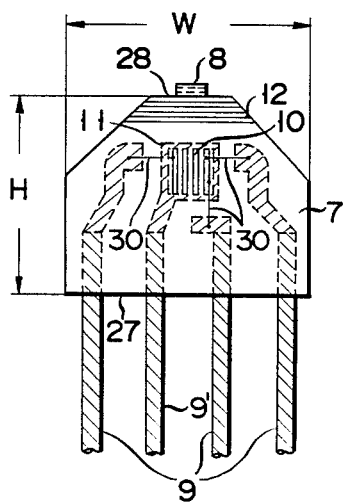 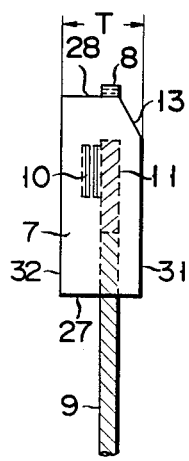
FIG. 4A    FIG. 4B

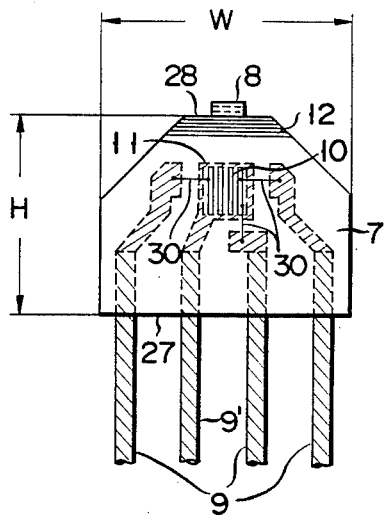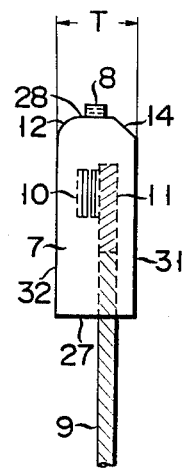
FIG. 5A  FIG. 5B
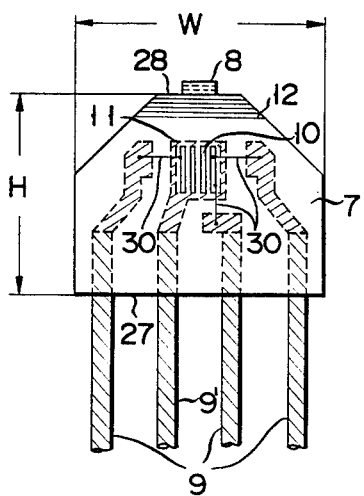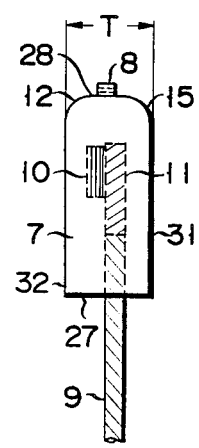
FIG. 6A  FIG. 6B

SEMICONDUCTOR DEVICE

BACKGROUND OF THE INVENTION

1. Field of the Invention

This invention relates to a semiconductor device, and more particularly to the improvement of a single-in-line (SIL) type package for a Hall sensor.

2. Description of the Related Art

A Hall sensor functions to convert variation in a magnetic field into an electrical signal by use of the Hall effect, and is adapted to detect the position of a motor.

FIG. 1A is a front view of the conventional Hall sensor and FIG. 1B is a side view thereof. The conventional Hall sensor shown in FIG. 1 includes pellet 10 which is fixed to Hall sensor bonding plate 11 by soldering, and which is connected to lead terminals 9 and 9' to be connected with external devices. Lead terminal 9' extends from Hall sensor bonding plate 11, and lead terminals 9 are each connected to a corresponding terminal electrode section (not shown) formed on pellet 10 via extremely thin wire 30 of, for example, gold or aluminum by a wire bonding method. The pellet and the extremely thin wire are sealed in package 7 of thermosetting mould resin such as epoxy resin, and thus protected from the exterior. Package 7 projects residual resin portion 16 from the center of edge portion 29. Edge portion 29 is an intersection between end face 28 opposite to end face 27 from which lead terminals 9 are drawn out and surface 31 disposed on the side of Hall sensor bonding plate 11. Residual resin portion 16 will be inevitably formed in a position corresponding to the gate position of a die (not shown) caused by setting sensor bonding plate 11 and the extremely thin wire into the die and then injecting resin into the die from the gate position of the die to form mould resin package 7. The residual resin portion can be removed after formation of the package. However, it is troublesome to remove the residual resin portion, making the manufacturing cost high. Further, it is difficult to completely remove the residual resin portion.

FIG. 2 shows an example of a positional relation between the Hall sensor and a motor whose position is detected by the Hall sensor. In FIG. 2, the left half portion of the brushless motor and the Hall sensor disposed near the brushless motor are shown. Further, in FIG. 2, stator core 26 on which coil 25 is wound is fixed on supporting member 24, and rotor 21 is disposed to surround stator core 26. Magnetic ferrite core 20 is fixed on the end portion of rotor 21. With this construction, rotor 21 may be rotated by supplying a current to coil 25 and thus the motor is driven. Hall sensor 23 is attached to printed board 22 and is disposed near the motor. In the assembling operation, Hall sensor 23 is first fixed on printed board 22, and then stator core 26 is placed on supporting member 24 above Hall sensor 23 and fixed thereon by screws or the like. Further, rotor 21 is disposed over stator core 26. In general, the Hall sensor used to detect the rotation position of the motor is arranged near the coil of the motor in order to enhance the sensitivity of the Hall sensor. The coil of the assembled motor may not be uniformly wound and the right and left portions of the coil tend to be differently wound with respect to stator core 26. Therefore, the mounting position of coil 25 with respect to stator core 26 cannot be uniformly set, and consequently package 7 of Hall sensor 23 to be arranged near coil 25 may be easily brought into contact with, coil 25. In the conventional Hall sensor, residual portion 16 of end face 28 of moulded resin package 7 which lies on the side of pellet 10 is formed to have a sharp edge For this reason, if end portion 17 of package 7 comes into contact with coil 25, the coil will be damaged and may be cut off in the worst case.

In general, the Hall sensor is used with surface 32 on the side of pellet 10 of the Hall sensor facing the motor coil, but it is sometimes used with surface 31 on the side of Hall sensor bonding plate 11 facing the motor coil. In the latter case, residual resin portion 16 projecting from that edge of package 7 lies near the coil. For this reason, the Hall sensor disposed near the motor coil may more easily come into contact with the motor coil so as to cut off the motor coil. Secure prevention against the cut-off of the coil does not permit Hall sensor 10 and coil 23 to position sufficiently close to each other because of the presence of residual resin portion 16.

As described above, it is necessary to place the Hall sensor sufficiently close to the motor coil in order to enhance the sensitivity thereof. However, in the conventional Hall sensor, the edge portion of surface 31 or 32 may come into contact with the coil to cut off the coil in a case where either one of surfaces 31 and 32 is positioned to face the motor coil.

SUMMARY OF THE INVENTION

A first object of this invention is to provide a Hall sensor which can be positioned close enough to the motor coil in order to enhance the sensitivity thereof and will not easily cut off the motor coil.

A second object of this invention is to provide a Hall sensor which can attain the first object in a condition that the surface on the side of the pellet of the Hall sensor is set to face the coil.

A third object of this invention is to provide a Hall sensor which can attain the first object in a condition that the surface on the side of the Hall sensor bonding plate of the Hall sensor is set to face the coil.

A fourth object of this invention is to provide a Hall sensor which can attain the first object in a condition that the surface on the side of either one of the pellet and Hall sensor bonding plate of the Hall sensor is set to face the coil.

A semiconductor device of this invention comprises a moulded resin package which is resin-sealed in substantially a rectangular plate form for protection of a pellet of a Hall sensor, the package having a first end face from which lead terminals are drawn out and a second end face opposite to the first end face and at least one of edge portions of the second end face having an inclined portion which is outwardly curved or tapered.

Unlike the moulded resin sealed package of the conventional Hall sensor, the Hall sensor of this invention has the curved or tapered inclined portion on the edge portion of the second end face. Therefore, even when the motor coil is brought into contact with the edge portion of the moulded resin package, they will be in area-contact with each other and no stress concentration occurs on the motor coil. As a result, there is no possibility that the coil is cut off, and the Hall sensor can be placed sufficiently close to the coil and the sensitivity of the Hall sensor can be enhanced.

BRIEF DESCRIPTION OF THE DRAWINGS

FIGS. 1A and 1B are front and side views showing the construction of the conventional semiconductor device;

FIG. 2 is a schematic diagram showing the arrangement of a Hall sensor and a motor whose position is detected by the Hall sensor;

FIGS. 3A and 3B are front and side views showing the construction of a semiconductor device according to a first embodiment of this invention;

FIGS. 4A and 4B are front and side views of a semiconductor device according to a second embodiment of this invention;

FIGS. 5A and 5B are front and side views of a semiconductor device according to a third embodiment of this invention; and FIGS. 6A and 6B are front and side views of a semiconductor device according to a fourth embodiment of this invention.

DETAILED DESCRIPTION OF THE PREFERRED EMBODIMENTS

There will be now described a semiconductor device according to one embodiment of this invention.

FIGS. 3A and 3B show a semiconductor device according to a first embodiment of this invention. In FIGS. 3A and 3B, pellet 10 for a Hall element is bonded and fixed on Hall sensor bonding plate 11, lead terminal 9' for connection with an external device is formed to extend from Hall sensor bonding plate 11, and the other three lead terminals 9 are connected to terminal electrode sections formed on pellet 10 via extremely thin wires 30 of gold, aluminum or the like. Pellet 10 and extremely thin wires 30 are sealed in moulded resin package 7 and are thus protected from the exterior. Moulded resin package 7 is formed to have height H of 2.3 mm between first end face 27 from which lead terminals 9 are drawn out and second end face 28 opposite to first end face 27; width W of 4.0 mm in a direction perpendicular to lead terminals 9; and thickness T of 1 mm in a direction perpendicular to the directions of height H and width W. In the package, residual resin portion 8 is provided in a position apart from upper edge portion 29 of second end face 28, preferably in a position separated by approx. 0.4 mm from both ends of the second end face in the thickness direction. Further, the edge portion of second end face 28 on the side of pellet 10 is formed to have inclined portion 12 which is outwardly curved with a radius of curvature of 0.10 mm to 0.30 mm, preferably 0.25 mm.

Package 7 is formed by use of a die having the contour of a cavity corresponding to the outer surface of the package. That is, package 7 is formed by inserting pellet 10, Hall sensor bonding plate 11, extremely thin wire 30 and the like into the die, and injecting resin into the die from the gate thereof. The gate of the die is positioned in substantially the central portion of second end face 28 in the thickness direction so as to be separated from the edge portions of second end face 28. The residual resin portion is formed correspondingly in position to the gate. The inclined portion may be formed by (1) injecting resin into the die which is formed to have a corresponding curved edge portion so as to form moulded resin package 7 having curved inclined portion 12, or (2) injecting resin into the die having no curved edge portion to form a package having no inclined portion and subjecting moulded resin package 7 to a polishing process or the like so as to form curved inclined portion 12.

With the construction of this invention, inclined portion 12 of package 7 of Hall sensor 23 is disposed to face coil 25 when Hall sensor 23 is installed on the motor as shown in FIG. 2. In this case, even if inclined portion 12 comes into contact with coil 25, they will be set in area-contact with each other so that no stress concentration may occur on the motor coil. Therefore, the coil will not be damaged or cut off. Also, in a case where edge portion 29 of second end face 28 will be positioned to face coil 25, residual resin portion 8 will not come into contact with the coil since residual resin portion 8 is positioned in substantially the central portion apart from the edge portions of second end face 28. Therefore, it becomes possible to set Hall sensor 23 close to motor coil 25, thus enhancing the sensitivity of Hall sensor 23.

FIG. 4 shows a second embodiment of this invention. In this embodiment, upper edge portion 29 on the side of Hall sensor bonding plate 11 is formed to have tapered inclined portion 13 instead of outwardly curved inclined portion 12 which is formed on the upper edge of surface 31 in the first embodiment. The inclined portion is formed by cutting out the package along a plane including a line which is separated by 0.1 to 0.3 mm from the upper edge portion in the height (H) direction and a line which is separated by 0.1 to 0.3 mm from the upper edge portion in the width (W) direction. This embodiment is the same as the first embodiment in other respects.

The Hall sensor of this embodiment has the same effect when inclined portion 13 of second end face 28 is disposed to face coil 25.

FIG. 5 shows the third embodiment of this invention. In this embodiment, outwardly curved inclined portion 12 which is the same as in the first embodiment is provided, and in addition, the edge portion of package 7 which is opposite to inclined portion 12 is formed to have tapered inclined portion 14. The inclination degree of inclined portion 14 is substantially the same as that of inclined portion 13 in the second embodiment. This embodiment is the same as the first embodiment in other respects.

Since the Hall sensor of this embodiment has outwardly curved inclined portion 12 and tapered inclined portion 14, the coil will not be damaged or cut off by inclined portion 12 or 14 even if one of inclined portions 12 and 14 is disposed close to the motor coil. Therefore, the sensitivity of the Hall sensor can be improved without paying any attention to the possibility of the cut-off of the coil. Further, the mounting direction of the Hall sensor with respect to the motor coil can be selectively set.

FIG. 6 shows the fourth embodiment of this invention. In this embodiment, outwardly curved inclined portion 12 which is the same as in the first embodiment is provided, and in addition, the edge portion of package 7 which is opposite to inclined portion 12 is formed to have inclined portion 15 which is outwardly curved with a radius of curvature of approx. 0.1 mm to 0.3 mm. In this embodiment, the same effect and construction as the third embodiment can be attained.

In the above embodiments, the Hall sensor is formed with a specified size. However, height H, width W and thickness T of moulded resin package 7 are not limited to the above values, and this invention can be applied to ordinary Hall sensors. Further, in the third and fourth embodiments shown in FIGS. 5 and 6, that edge portion of second end face 28 of moulded resin package 7 may be formed to have a tapered inclined portion.

In view of the effect of preventing the cut-off of the coil, it is preferable to set the inclination degree of the inclined portion of the Hall sensor as large as possible. In addition, in view of the sensitivity of the Hall sensor, it is preferable to dispose pellet 10 for the Hall element closer to second end face 28 than to the intermediate position between first and second end faces 27 and 28. The arrangement enhances the mechanical strength of the whole Hall sensor. That is, when Hall sensor 23 is brought into contact with motor coil 25, a mechanical stress may be applied to Hall sensor package 7 and lead terminals 9, 9'. However, with the above arrangement, since a relatively long portion of lead terminal 9, 9' can be moulded in package 7, the Hall sensor can withstand the mechanical stress. Thus, the arrangement of the pellet is determined with a compromise between prevention of the cut-off of the coil and the sensitivity of the Hall sensor. The inventors of this invention considered the form of the package which permits the pellet to be easily disposed close to the coil in the process of completing this invention. In this process, it was found that the sealing ability will be lowered when inclined portion 12 is set extremely close to pellet 10 and it is necessary to separate the outer surface of the package from the pellet by at least 0.3 mm in any position. In view of this fact, it is understood that it is preferable to separate any portion of the pellet by at least 0.3 mm from the surface of package 7 and set the pellet in the upper position. Further, it is preferable to set the inclination degree of inclined portions 12 and 13 to a larger value in a limited range between second end face 28 of package 7 and pellet 10. In this respect, the externally curved inclined portion is preferable because it permits the pellet to be disposed in a higher position in comparison with the tapered inclined portion.

What is claimed is:

1. A semiconductor device for a Hall sensor positioned near a motor coil, comprising:
   a molded resin package formed in substantially a rectangular form;
   a pellet for a Hall element disposed inside said package;
   a Hall sensor bonding plate on which said pellet is fixed;
   a plurality of lead terminals which are disposed at one end near said pellet, the other ends of said lead terminals being formed to extend from said package to the exterior; and
   means for electrically connecting said pellet to said lead terminals;
   wherein said molded resin package includes a first end face from which said lead terminals are drawn out;
   a second end face opposite to the first end face;
   a first surface lying on the side on which said pellet is fixed;
   a second surface lying on the side opposite to the side on which said pellet is fixed; and
   an inclined portion for disposition adjacent said motor coil formed in at least one of a first edge portion made by the second end face and the first surface and a second edge portion made by the second end face and the second surface.

2. A semiconductor device according to claim 1, wherein said pellet and Hall sensor bonding plate are disposed close to the second end face but are separated by at least 0.3 mm from any surface of said package.

3. A semiconductor device according to claim 1, wherein said inclined portion formed on the first edge portion has an upwardly curved surface.

4. A semiconductor device according to claim 3, wherein said inclined portion is formed to have an outwardly curved surface with a radius of curvature of 0.10 mm to 0.30 mm.

5. A semiconductor device according to claim 1, wherein said inclined portion formed on the second edge portion has a surface selected from the qroup consisting of an outwardly curved surface and tapered surface.

6. A semiconductor device according to claim 5, wherein said outwardly curved surface has a radius of curvature of 0.10 mm to 0.30 mm.

7. A semiconductor device according to claim 1, wherein said package has a residual resin portion caused by effecting the resin injection to form said moulded resin package, the residual resin portion being set apart from the periphery of the second end face.

8. A semiconductor device according to claim 7, wherein said residual resin portion is set in substantially the central portion of the second end face in the thickness direction of said package.

9. A Hall sensor device for a motor coil, having a generally arcuate surface spaced a predetermined height above and opposing a substrate surface supporting the sensor device, said sensor device comprising:
   a molded resin housing including a bottom end face for attaching to the substrate proximate said motor coil, a first surface perpendicular to the bottom end face and positioned adjacent to said motor coil, a second surface perpendicular to the bottom end face opposite the first surface, a top end face opposite the bottom end face, and an inclined surface defining an intersection of the first surface and top end face, for opposing and area contacting the arcuate surface of the motor coil at a position tangential to said arcuate surface without damage to said motor coil;
   a bonding plate disposed within the housing;
   a pellet for a Hall element fixed to said bonding plate facing the second surface;
   a plurality of lead terminals proximate said pellet and extending out of said housing through said bottom end face; and
   means for electrically connecting said pellet to said lead terminals.

10. The semiconductor of claim 9 wherein said inclined surface is configured as an arcuate surface having a radius of 0.1 mm to 0.3 mm.

11. The semiconductor of claim 9 wherein said inclined surface is configured as a tapered surface.

12. The semiconductor of claim 9 wherein an edge defining an intersection of said second surface and top end face is configured as a tapered surface.

13. The semiconductor of claim 9 wherein the edge is configured as an arcuate surface.

14. The semiconductor of claim 13 wherein the arcuate surface of said edge includes a radius of 0.1 mm to 0.3 mm.

15. The semiconductor of claim 9 wherein said housing includes a residual resin portion projecting from said top end face, spaced away from the inclined surface.

16. The semiconductor of claim 15 wherein said residual portion is disposed in a substantially central portion of said top end face.

* * * * *